Oct. 12, 1965
J. D. HUSHER ETAL
INTEGRATED CIRCUIT SEMICONDUCTOR
NARROW BAND NOTCH FILTER
3,212,033
Filed Oct. 25, 1960
2 Sheets-Sheet 1

INVENTORS
John D. Husher &
Salvatore L. Iannazzo
BY R. J. Brodahl
ATTORNEY

United States Patent Office 3,212,033

Patented Oct. 12, 1965

3,212,033
INTEGRATED CIRCUIT SEMICONDUCTOR NARROW BAND NOTCH FILTER

John D. Husher, West Point City, and Salvatore L. Iannazzo, Youngwood, Pa., assignors to Westinghouse Electric Corporation, East Pittsburgh, Pa., a corporation of Pennsylvania Filed Oct. 25, 1960, Ser. No. 64,854
6 Claims. (Cl. 333—70)

This invention relates to an improved narrow band rejection filter device and to a tunable monolithic semiconductor structure for use therein.

Frequency selectivity is normally obtained in electronic systems by means of inductor capacitor (L.-C.) tuned circuits. The problem that arises when such devices as frequency selective amplifiers or filters circuits are to be constructed from solid state materials in accordance with molecular engineering concepts is the one of creating the frequency selectivity without the use of L.-C. tuned circuits. This is necessary because at the present time the inductance characteristic is difficult to provide by monolithic construction.

As is well known in the communications art, there are a number of circuits for obtaining frequency selectivity which employ only resistance and capacitance. Some of the better known of these are the Wien bridge, the twin-T and the bridged-T null networks. Other frequency selective R-C circuits are described in the literature. However, in general these devices employ lumped parameters, and in the construction and fabrication of semiconductors attempts to concentrate the effects of distributed parameters into localized regions so that the distributed parameters could act electrically more like lumped parameters in the circuits have been in general unsuccessful for the reason that localization of parameters requires the accurate placement of impurities in the semiconductor material, and under present techniques the accurate placement of impurities in semiconductors is sometimes very difficult to obtain.

In copending application S.N. 5,045, filed January 27, 1960, in the name of William M. Kaufman, assigned to the assignee of this application there is disclosed and claimed a narrow band rejection filter circuit in a monolithic structure employing a single p-n junction, which must be reverse biased to provide a distributed capacitance-resistance filter network between input and output terminals. Tuned amplifiers in functional electronic block form can be obtained by placing a narrow band rejection filter, or what is commonly known in the art as a "notch" filter, in the feedback loop of the amplifier. In many cases it is desirous to use the collector or some other source of D.-C. voltage available in the amplifier circuit to reverse bias the p-n junction to obtain tuning. With only one p-n junction, when the p-n junction is forwardly biased, the "notch" filter effect is not obtained as in this direction the junction is substantially resistive. Thus a bias voltage of the correct reverse polarity must be provided in the feedback loop to provide the desired tuning. In accordance with the present invention a p-n-p type construction is provided which, in effect, gives two rectifying junctions, connected back-to-back in the series so that inherently one is always forward biased when the other is reverse biased for either polarity. Accordingly, the forward biased junction provides primarily a small resistive impedance while the reversed bias junction provides primarily a capacitance impedance. The p-n-p construction of the present invention therefore permits taking advantage of the D.-C. voltage available in the system circuitry, regardless of its polarity, for obtaining the capacitive impedance in one of the junctions. However, if desired, a separate supplemental bias voltage may be provided for desired tuning.

Another advantage of the present construction over that of the aforementioned copending application is that the p-n-p construction, as shown in the drawings, facilitates fabrication of the lumped resistor into the same monolithic block and results in a simpler physical structure of reduced size. Furthermore the present construction facilitates a selective adjustment of an integral lumped resistor to aid in selectively controlling the null frequency of the filter.

In copending application S.N. 88,436, filed February 10, 1961, in the name of John Philips and Charles E. Benjamin for Bridged-T Filter there is described and claimed a distributed bridged-T filter solid circuit network in a monolithic block which includes two regions of opposite type semiconductivity joined in a p-n junction. This junction is adapted to be reversely biased to obtain the necessary capacitive impedance and one of the regions serving as the column terminal for the distributed capacitance is extended and so proportioned as to constitute the lumped resistive impedance which is properly adjusted in value and related to the distributed resistance capacitance of the other semiconductor region to give the improved notch filter effect. The present invention is distinguished from this second copending application in that the latter has the improved p-n-p construction so that the device has the necessary capacitive impedance with either biasing potential.

It is therefore an object of the present invention to provide an improved narrow band rejection filter employing a monolithic frequency selective structure.

It is a further object of the present invention to provide an improved narrow band rejection filter employing a monolithic structure in which two p-n junctions are used to provide desired biasing, fabrication and size advantages.

Another object is to provide a new and improved p-n-p type monolithic unit for use in a notch type filter in which two rectifying junctions are connected back-to-back in series relation so that its capacitive impedance is substantially insensitive to bias potential.

Another object is to provide a new and improved p-n-p type monolithic solid circuit network for use in a notch type filter in which two rectifying junctions are connected back-to-back in series so that one of its junctions is back biased while the other junction is forward biased for either polarity applied thereto and in which the common input-output side of the monolithic unit is extended and so proportioned as to constitute the lumped resistive impedance to produce the improved notched filter effect.

These and other objects will become more clearly apparent after a study of the following specification when read in connection with the accompanying drawings, in which.

Figure 1A:
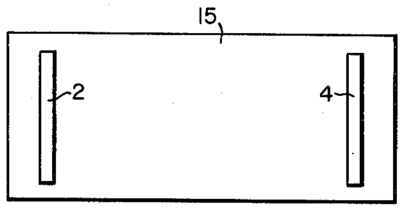
FIGURE 1A is a top plan view of a narrow-band rejection filter device according to the present invention.
Figure 1B:
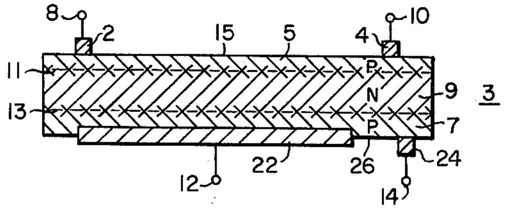
FIG. 1B is a side view in cross-section of the filter construction of FIG. 1A.
Figure 1C:
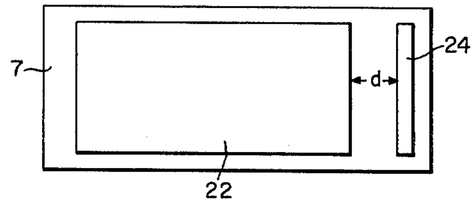
FIG. 1C is a bottom plan view of the filter construction of FIG. 1A.

In FIGS. 1A–1B–1C, which are three views of one device embodying the invention, is shown a single crystal wafer 3 of n-type semiconductive material, e.g. silicon, which has been diffused with a p-type doping material, e.g. gallium.

As shown in FIG. 1B there are formed two regions of p-type semiconductivity, an upper region 5, and a lower region 7, and a center n-type region 9. Between regions 5 and 9 and regions 7 and 9 are formed p-n junctions 11 and 13.

In FIG. 1A, two ohmic contacts 2 and 4, e.g. made of gold, are fused to the top surface 15 of region 5.

In FIGS. 1B and 1C is shown a metal contact plate 22, e.g. made of gold, fused to the bottom surface 26 of region 7. An ohmic contact 24, also for example made of gold, is fused to the surface 26, but is separated from plate 22 by a predetermined distance *"d."* The distance *"d"* thus being determinative of the resistance R between plate 22 and contact 24. Terminals 8, 10, 12 and 14 are connected to contacts 2, 4, 22, and 24, respectively to provide external terminal connections.

In the operation of the apparatus of FIG. 1, assume that a sinusoidal signal of variable frequency is applied to the input terminals 8 and 12. Assume first for purposes of explanation that the resistance R due to the separation *"d"* between contacts 22 and 24 is shorted so that contact plate 22 is directly connected to the contact 24. As the frequency of the signal at input terminals 8 and 12 is increased, the portion of the applied signal which is passed through the wafer 3 to the conducting plate 22 will increase in accordance with the decreasing reactance of the capacitor, and ultimately a frequency will be reached at which substantially all of the signal passes through the wafer dielectric, the effective impedance of the capacitor approaching zero, so that the filter would have the characteristics of a low-pass filter.

Figure 2:
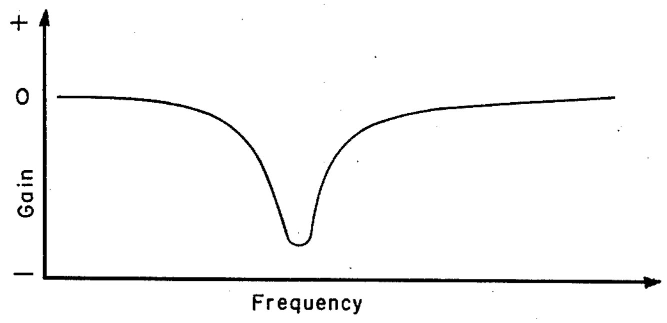
FIG. 2 is a graph illustrating the operation of the apparatus of FIG. 1.

An understanding of the operation of the circuit may be simplified by making an analysis as if the circuit had lumped circuit parameters, in which portions of the signal applied to terminal 8 may follow three paths. In actuality, because of the distributed resistance and distributed capacitance of the monolith, each of these three paths consists of many paths, which may overlap in portions thereof. Assume now by way of description that the resistor R is in the circuit, and that this resistor approaches the perfect resistor in that it has no substantial capacitance. A first and direct path for the signal is provided through the p-type region 5 between contact 2 and contact 4; an additional or second signal path is provided from contact 2 through wafer 3 to plate 22, along plate 22 up through wafer 3 to contact 4; and still an additional or third signal path is provided from contact 2 through the wafer 3 to plate 22 and through the resistor R to contact 24. The second and third paths are frequently responsive, and as the frequency of the signal is increased the impedance of the third path will constantly decrease with reference to the resistance of the first path through contacts 2 and 4, and the gain of the device will decrease as shown in the curve of FIG. 2 until the null is reached. At this point on the curve of FIG. 2, the voltage or signal at terminal 10 is substantially that resulting from signal division between contacts 2 and 4, and points 2 and terminal 12, resulting from the instant impedances of all paths. As the frequency is further increased the resistance of the second signal path through the dielectric of the wafer 3 established in parallel with the current path between contacts 2 and 4, that is, the path from contact 2 through dielectric wafer 3 to conducting plate 22 and up through the dielectric in the portion thereof adjacent contact 4 to contact 4 to output terminal 10 becomes increasingly smaller so that the total effective impedance between contacts 2 and 4 further decreases, whereas the impedance of the third path which includes resistance R remains substantially constant, causing the gain curve of FIG. 2 to increase in the manner shown. It will be seen that the null or notch filter effect is to some extent dependent upon the value of the resistance R.

Figure 3:
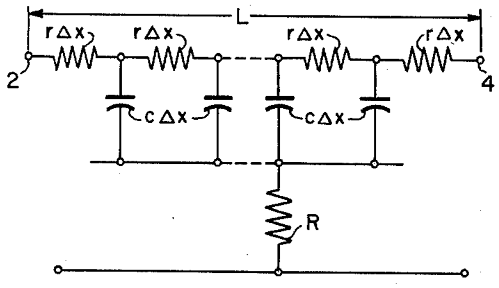
FIG. 3 is an equivalent electrical circuit of the rejection filter of FIG. 1.

Particular reference should be made now to FIG. 3 in which an equivalent electrical circuit of the structure of FIG. 1 is shown. An analysis of the equivalent circuit may be made by methods similar to those discussed in an article entitled "Distributed Parameter Networks for Circuit Miniaturization" by Charles K. Hager, appearing in the Proceedings of the Joint Electronic Components Conference, I.R.E., A.I.E.E., May, 1959. In analyzing the circuit of FIG. 3, L is the length of the device as measured between ohmic contacts 2 and 4, FIG. 1; $r$ and $c$ are the resistance and capacitance per unit length. Mathematical analysis, more fully set forth in the forementioned copending application of William F. Kaufman, shows that the device will produce the effect of a notch filter with a true zero null under certain readily obtainable conditions. Utilizing nodal equations for one section of the circuit of FIG. 3 and taking the limit as $\Delta X \rightarrow 0$ will produce a system of partial differential equations. Computations can be simplified by ignoring resistance in series with the capacitors since this is negligible, the device being assumed to be rather thin, and the highly doped region being of rather low resistivity. Furthermore, assuming sinusoidal driving functions and expressing all time variation in terms of complex phasor notation, the partial differential equations reduce to second order ordinary differential equations. The solution for gain, the ratio of output to input voltage, under no-load conditions is $$G\alpha\left(\frac{\omega}{\omega_1}\right)=\left|\operatorname{sech}\left[(1+j)\left(\frac{\omega}{\omega_1}\right)^{1/2}\right]+\frac{1-\operatorname{sech}\left[(1+j)\left(\frac{\omega}{\omega_1}\right)^{1/2}\right]}{1+\frac{\alpha}{(1+j)}\frac{1}{\left(\frac{\omega}{\omega_1}\right)^{1/2}}\coth\left[(1+j)\left(\frac{\omega}{\omega_1}\right)^{1/2}\right]}\right|$$

where $$\alpha=\frac{rL}{R}$$

and $$\omega_1=\frac{2}{L^2rc}$$

$r$ is the distributed resistance per unit length,
$c$ is the distributed junction capacitance per unit length,
L is the device length,
R is the resistance of the p-type region between contact 22 and contact 24 which is a function of the distance *"d."*
$\omega$ is the angular frequency of the sinusoidal excitation.

It will be seen that the expression for gain given above is easily calculated as a function of two parameters $$\frac{\omega}{\omega_1} \text{ and } \alpha$$

The phase angle, $\phi$ is given by the formula $$\phi=\tan^{-1}\left(\frac{b}{a}\right)$$

where:

$a=ReG\alpha$
$b=ImG\alpha$. (R*e* is the real part of G and I*m* is the imaginary part of G$\alpha$, according to the above equation.)

Figure 4:
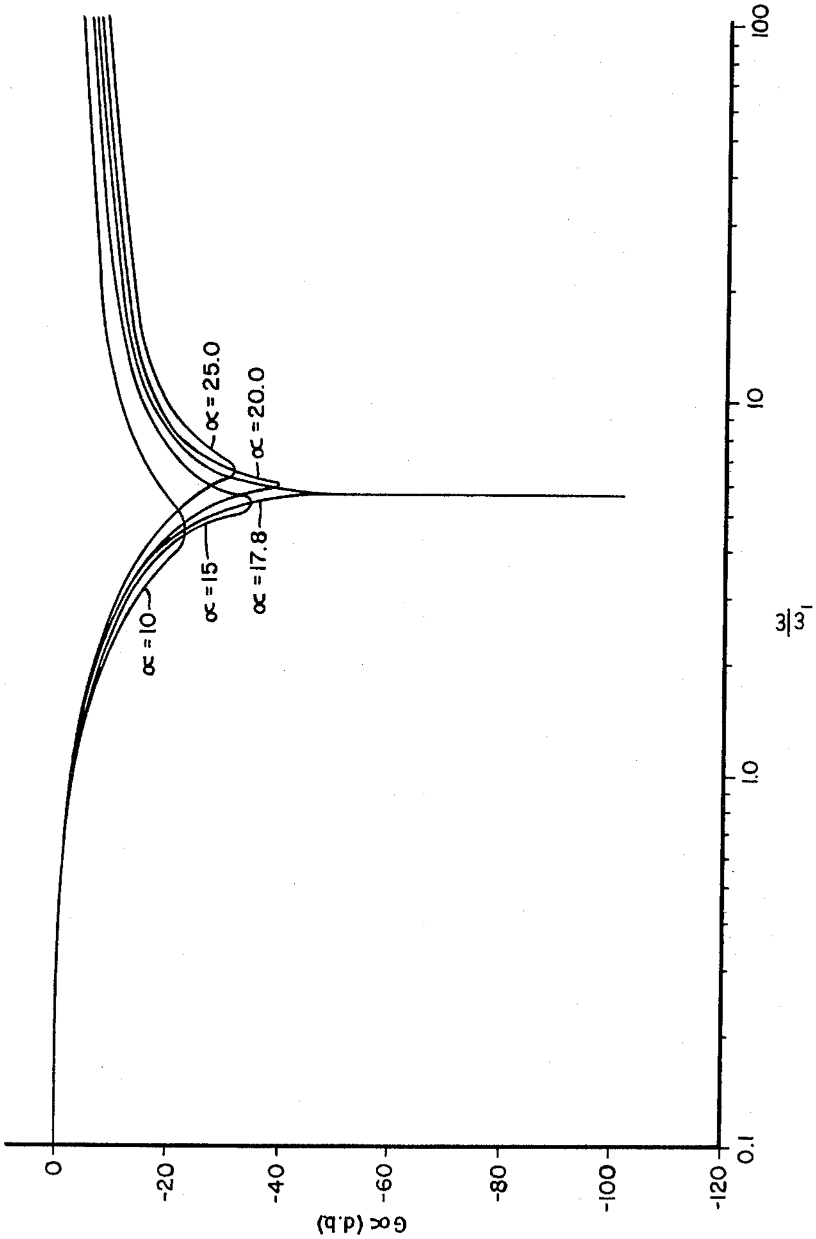
FIG. 4 is a graph illustrating the frequency response of the apparatus of FIG. 1.

Particular reference should be made now to FIG. 4 where the response or gain measured in decibels is plotted as a function of frequency for various values of $\alpha$. The gain never exceeds unity.

The calculated curves indicate that $\alpha=17.8$ is very nearly optimum for no-load operation with $\alpha=17.8$ providing the deepest null and the narrowest bandwith. The null occurs at $$\frac{\omega}{\omega_1}=5.5935$$

The word "doped" is employed herein to indicate impurities of the donor and acceptor types added to intrinsic semiconductor material.

Another advantage of the semiconductor embodiments of the instant invention is the adjustability and tunability of the devices. By changing the value or amplitude of the reverse bias potential, both $r$ and $c$ can be changed; therefore it is possible to alter the frequency at which the null occurs. Some compensating adjustment may be desirable in the value of R in order to maintain the optimum $\alpha$. Resistor R may be made variable if desired by adjusting the distance "$d$" between contacts 22 and 24 or by etching the surface 26 between these contacts.

In summary, the semiconductor embodiments of the invention provide novel circuit arrangements in which an inherent resistance R of the device is used in connection with distributed resistance and distributed capacitance of a reverse-biased p-n semiconductor junction to obtain null or "notch filter" circuit performance. It will be readily understood that the n- and p-type regions could be interchanged and the polarity of the D.-C. bias reversed without any change in operation as two p-n junctions are used in the construction; thus substantially the same equivalent circuit is obtained with either polarity bias. Furthermore, the invention contemplates other ways in which the reverse bias potential can be applied to the junction. The invention includes other arrangements of the ohmic contacts on region 5.

Among the advantages provided by the instant invention over lumped parameter null circuits are particularly to be noted those which lie in fabrication techniques. The invention herein described may be simply created from an elementary semiconductor structure of very small size. Samples 250 mils long, 150 mils wide and 4 mils thick have been fabricated.

In final summary, the invention in its broadest aspect consists of a monolithic structure, which may be a semiconductor structure, having ohmic connections thereto providing filter input and filter output terminals. The monolithic structure includes resistive, capacitative, and conductive areas including an area providing distributed resistance between a first filter input and a first filter output terminal, an area forming distributed capacitance adjacent the distributed resistance, and an impedance forming area. This impedance forming area may be almost purely capacitive in nature and may be connected between the first input and first output terminal, or the impedance forming area may be resistive and connected between the distributed capacitance and both the second input and second output terminals.

Whereas the invention has been shown and described with respect to some embodiments thereof which give satisfactory results, it should be understood that changes may be made and equivalents substituted without departing from the spirit and scope of the invention.

We claim as our invention.

1. A narrow band filter device comprising a single crystal wafer of semiconductive material having first and second regions of a first type semiconductivity on opposite sides, respectively, of said wafer and separated by a third region of a second type semiconductivity; a p-n junction between each of said regions of first and second type semiconductivity; a first and a second ohmic contact spaced apart on the outer surface of said first region of first type semiconductivity; a third ohmic contact covering a major portion of the outer surface of said second region of first type semiconductivity; and a fourth ohmic contact on the same surface as said third contact and being separated from said third contact by a predetermined distance.

2. A narrow band filter device comprising a single crystal wafer of semiconductive material having first and second regions of p-type semiconductivity separated by a third region of an n-type semiconductivity; a p-n junction provided between each of said adjacent regions of a p- and n-type semiconductivity; first and second ohmic contacts spaced apart on the outer surface of said first region of p-type semiconductivity; a third ohmic contact covering a substantial portion of the surface of said second region of p-type semiconductivity; and a fourth ohmic contact on the same surface as said third contact and being separated from said third contact by a predetermined distance to provide a lumped resistive impedance of selected value.

3. A narrow band notch device comprising a single crystal wafer of semiconductive material having first and second regions of a first type semiconductivity separated by a third region of a second type semiconductivity; a boundary junction provided respectively between said regions of first and second type semiconductivity; first and second ohmic contacts spaced apart on the outer surface of said first region of first type semiconductivity for providing an electrical path of selected distributive resistance value; a third ohmic contact covering a predetermined portion of the outer surface of said second region of first type semiconductivity for providing a distributed capacitance and a fourth ohmic contact connected to said second region of first type semiconductivity and being electrically separated therefrom so as to provide a nondistributed resistance of selected value, said third and fourth ohmic contacts having areas of major and minor dimensions, respectively.

4. A monolithic semiconductor device constituting a notch filter comprising a single crystal wafer of semiconductor material having first and second regions of a first type semiconductivity separated by a third region of a second type semiconductivity; a p-n junction between each of said regions of first and second type semiconductivity providing two rectifying junctions in back-to-back relation; a first and second ohmic contact spaced apart on the non-junctioned surface of said first region of said first type semiconductivity and operative with said regions of first and second type semiconductivity to provide a series distributed resistance and capacitance, a third ohmic contact covering the major portion of the second non-junctioned surface of said first type semiconductivity and substantially coextensive in area with said junctions; and a fourth ohmic contact connected to said second region of first semiconductivity and electrically separated from said third ohmic contact for providing a selected nondistributed resistive impedance which bears a predetermined ratio to said series distributed resistance.

5. A monolithic semiconductor device constituting a distributed bridged-T filter comprising a single crystal wafer of semiconductor material having first and second regions of a first type semiconductivity separated by a third region of a second type semiconductivity thereby providing two rectifying p-n junctions connected in back-to-back relation, a first and a second ohmic contact connected at spaced points to said first region of said first type semiconductivity to provide a series distributed resistance through said first region of said first type of semiconductive material and operative with the other regions of semiconductive material to provide a distributed capacitance, a third ohmic contact covering the major portion of the second non-junctioned surface of the second region of said first type semiconductivity substantially coextensive with said p-n junctions, and a fourth ohmic contact connected to said second region of first type semiconductivity electrically separated from said third ohmic contact for providing a selected nondistributed resistive impedance which bears a selected ratio to said series distributed resistance.

6. A narrow band notch filter device as set forth in claim 1, wherein the p-n junctions are in back-to-back relation and wherein the gain for the filter may be expressed mathematically as set forth in the equation in column 4, the null frequency of the notch filter occurring when $$\frac{\omega}{\omega_1} \simeq 6$$

References Cited by the Examiner

UNITED STATES PATENTS

| | | | |
|---|---|---|---|
| 2,655,610 | 10/53 | Ebers | 307—88.5 |
| 2,777,057 | 1/57 | Pankove | 307—88.5 |
| 2,852,677 | 9/58 | Shockley | 317—235 |
| 2,889,499 | 6/59 | Rutz | 317—235 |
| 2,892,164 | 6/59 | Woll | 333—79 |
| 2,930,996 | 3/60 | Chow | 307—88.5 |
| 2,967,793 | 1/61 | Philips | 317—235 |
| 3,022,472 | 2/62 | Tannenbaum et al. | 307—88.5 |
| 3,118,114 | 1/64 | Barditch | 330—38 |

OTHER REFERENCES

Hager: Electronics, vol. 32, No. 36, pp. 33–49, Sept. 4, 1959.

Kaufman, W. M.: IRE Proc. "Theory of a Monolithic Null Device, September 1960, pp. 1540–1545.

Langford: Electronics, Dec. 11, 1959, pp. 49–52.

Lathrop et al.: Electronics, Semi-Conductor Networks for Microelectronics, pp. 69 to 78, May 13, 1960.

HERMAN KARL SAALBACH, *Primary Examiner.*

ELI J. SAX, *Examiner.*